(12) United States Patent
Allegato et al.

(10) Patent No.: US 9,718,675 B2
(45) Date of Patent: Aug. 1, 2017

(54) MICROELECTROMECHANICAL DEVICE WITH SIGNAL ROUTING THROUGH A PROTECTIVE CAP

(71) Applicant: STMICROELECTRONICS S.R.L., Agrate Brianza (IT)

(72) Inventors: Giorgio Allegato, Monza (IT); Barbara Simoni, Bareggio (IT); Carlo Valzasina, Gessate (IT); Lorenzo Corso, Ruginello (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/971,639

(22) Filed: Dec. 16, 2015

(65) Prior Publication Data

US 2016/0145096 A1    May 26, 2016

Related U.S. Application Data

(62) Division of application No. 13/922,033, filed on Jun. 19, 2013, now Pat. No. 9,452,922.

(30) Foreign Application Priority Data

Jun. 20, 2012  (IT) .............................. TO2012A0542

(51) Int. Cl.
*B81B 7/02* (2006.01)
*B81B 7/00* (2006.01)
*B81C 1/00* (2006.01)

(52) U.S. Cl.
CPC ............ *B81B 7/0074* (2013.01); *B81B 7/007* (2013.01); *B81B 7/008* (2013.01); *B81B 7/02* (2013.01);
(Continued)

(58) Field of Classification Search
CPC ...................................................... B81B 7/008
See application file for complete search history.

(56) References Cited

U.S. PATENT DOCUMENTS

| 4,314,225 A | 2/1982 | Tominaga et al. |
| 4,399,707 A | 8/1983 | Wamstad |

(Continued)

FOREIGN PATENT DOCUMENTS

| CN | 101519183 A | 9/2009 |
| CN | 10178867 A | 7/2010 |

(Continued)

*Primary Examiner* — Paul West
*Assistant Examiner* — Mark A Shabman
(74) *Attorney, Agent, or Firm* — Seed Intellectual Property Law Group LLP

(57) ABSTRACT

A microelectromechanical device includes: a body accommodating a microelectromechanical structure; and a cap bonded to the body and electrically coupled to the microelectromechanical structure through conductive bonding regions. The cap including a selection module, which has first selection terminals coupled to the microelectromechanical structure, second selection terminals, and at least one control terminal, and which can be controlled through the control terminal to couple the second selection terminals to respective first selection terminals according, selectively, to one of a plurality of coupling configurations corresponding to respective operating conditions.

20 Claims, 10 Drawing Sheets

(52) U.S. Cl.
CPC .... *B81C 1/0023* (2013.01); *B81B 2201/0235* (2013.01); *B81B 2201/0242* (2013.01); *B81B 2207/012* (2013.01); *B81B 2207/015* (2013.01); *B81B 2207/07* (2013.01); *B81B 2207/092* (2013.01); *B81B 2207/093* (2013.01); *B81B 2207/096* (2013.01); *B81B 2207/097* (2013.01); *B81C 2203/0118* (2013.01); *B81C 2203/0792* (2013.01); *H01L 2924/0002* (2013.01)

(56) References Cited

U.S. PATENT DOCUMENTS

| | | | |
|---|---|---|---|
| 4,528,853 A | 7/1985 | Lerch et al. | |
| 5,111,693 A | 5/1992 | Greiff | |
| 5,164,328 A | 11/1992 | Dunn et al. | |
| 5,168,344 A | 12/1992 | Ehlert et al. | |
| 5,259,247 A | 11/1993 | Bantien | |
| 5,285,690 A | 2/1994 | Koen et al. | |
| 5,438,859 A | 8/1995 | Yamashita et al. | |
| 5,650,567 A | 7/1997 | Ueda et al. | |
| 5,668,033 A | 9/1997 | Ohara et al. | |
| 5,719,334 A | 2/1998 | Parsons | |
| 5,723,904 A | 3/1998 | Shiga | |
| 5,750,926 A | 5/1998 | Schulman et al. | |
| 5,760,455 A | 6/1998 | Hierold et al. | |
| 5,864,063 A | 1/1999 | Otani et al. | |
| 5,905,203 A | 5/1999 | Flach et al. | |
| 6,025,767 A | 2/2000 | Kellam et al. | |
| 6,405,592 B1 * | 6/2002 | Murari | G01F 23/263 73/304 C |
| 8,459,109 B2 | 6/2013 | Caminada et al. | |
| 9,452,922 B2 | 9/2016 | Allegato et al. | |
| 2002/0141130 A1 * | 10/2002 | Lyke | H01H 1/0036 361/160 |
| 2007/0198187 A1 * | 8/2007 | Pasolini | G01P 15/125 73/489 |
| 2008/0295597 A1 | 12/2008 | Stewart | |
| 2009/0194829 A1 | 8/2009 | Chung et al. | |

FOREIGN PATENT DOCUMENTS

| | | |
|---|---|---|
| CN | 203582456 U | 5/2014 |
| EP | 1961696 A1 | 8/2008 |
| WO | 96/39632 A1 | 12/1996 |

* cited by examiner

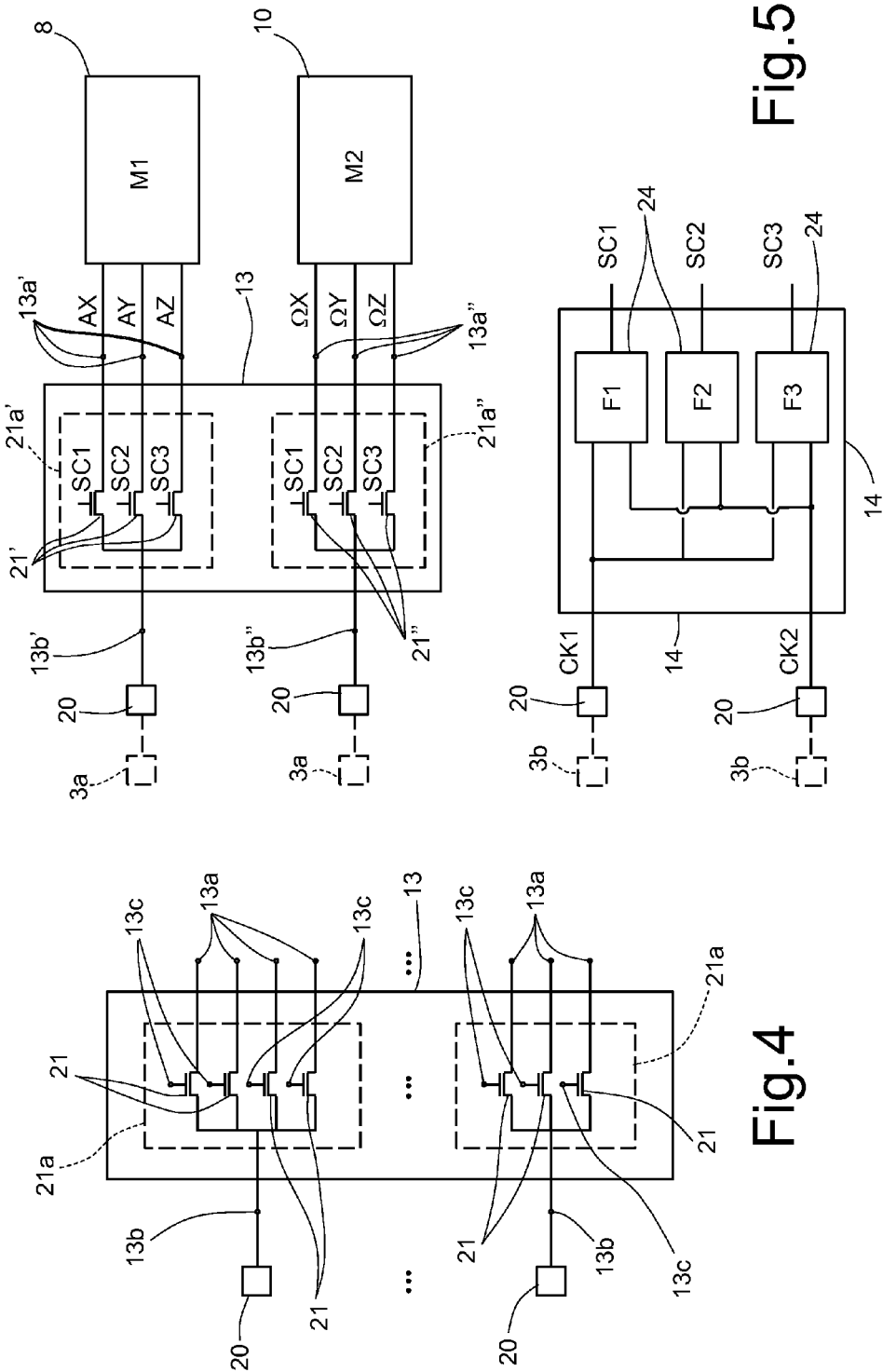

| F1 | | |
|---|---|---|
| CK1 | CK2 | SC1 |
| 0 | 0 | 0 |
| 0 | 1 | 0 |
| 1 | 0 | 1 |
| 1 | 1 | 0 |

| F2 | | |
|---|---|---|
| CK1 | CK2 | SC2 |
| 0 | 0 | 0 |
| 0 | 1 | 1 |
| 1 | 0 | 0 |
| 1 | 1 | 0 |

| F3 | | |
|---|---|---|
| CK1 | CK2 | SC3 |
| 0 | 0 | 0 |
| 0 | 1 | 0 |
| 1 | 0 | 0 |
| 1 | 1 | 1 |

MICROELECTROMECHANICAL DEVICE WITH SIGNAL ROUTING THROUGH A PROTECTIVE CAP

BACKGROUND

Technical Field

The present disclosure relates to a microelectromechanical device with signal routing through a protective cap and to a method of controlling the microelectromechanical device.

Description of the Related Art

As is known, the use of microelectromechanical systems (MEMS) has encountered an ever-increasing spread in various sectors of technology and has yielded encouraging results especially in the production of inertial sensors, microintegrated gyroscopes, and electromechanical oscillators for a wide range of applications.

Under the thrust of the increasing request for high performance and flexibility of use, the technology has rapidly developed and has led to the production of miniaturized microelectromechanical sensors capable of detecting different independent quantities. For example, numerous solutions have been proposed regarding multiaxial movement sensors (accelerometers and gyroscopes) using microstructures integrated in a single die.

The trend towards miniaturization and to integration has encountered, however, a limit in the need to enable communication of the sensors integrated in the die with the external environment, in particular with the control devices that are typically obtained in separate dice. An important part of the die integrating the microstructures, in fact, is dedicated exclusively to accommodating contact pads for connection with the outside world. Paradoxically, whilst sophisticated solutions from the mechanical and electrical standpoint enable design of extremely compact microstructures, the area used by the pads and by the corresponding connection lines cannot be reduced beyond a certain limit.

Integrated sensors capable of detecting several independent quantities hence use a considerable expenditure in terms of area.

In addition to the technical difficulties to be tackled for design of the connections, the yield per unit area is low, and the cost of the device is high.

BRIEF SUMMARY

The present disclosure is directed to providing a microelectromechanical device and a method of controlling the microelectromechanical device.

One embodiment of the present disclosure is directed to a microelectromechanical device that includes a body including a microelectromechanical structure, a cap bonded to the body and electrically coupled to the microelectromechanical structure through conductive bonding regions. The cap includes a selection module having first selection terminals coupled to the microelectromechanical structure, second selection terminals, and a control terminal configured to couple the second selection terminals to respective ones of the first selection terminals in accordance with one of a plurality of coupling configurations corresponding to a respective one of a plurality of operating conditions.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein:

FIG. 4 is a simplified electrical diagram of a detail of the microelectromechanical device of FIG. 1;

FIG. 5 is a simplified electrical diagram of a variant of the detail of FIG. 4;

DETAILED DESCRIPTION

Figure 1:
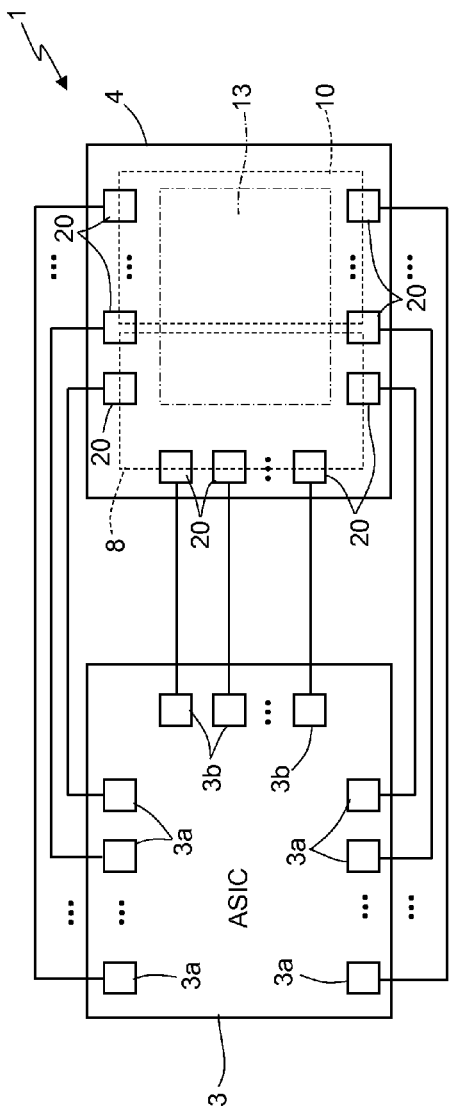
FIG. 1 is a simplified top plan view of a microelectromechanical device according to an embodiment of the present disclosure.
Figure 2:
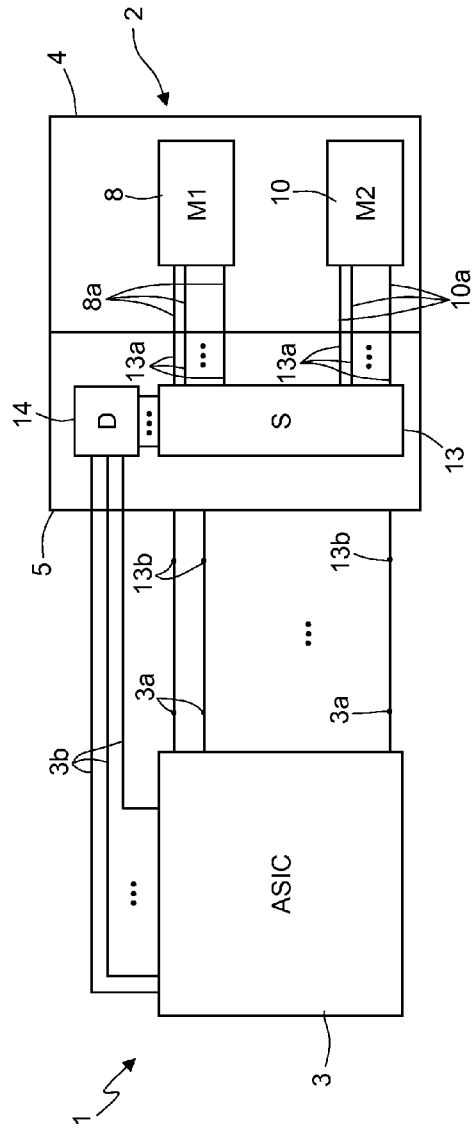
FIG. 2 is a simplified block diagram of the microelectromechanical device of FIG. 1.

With reference to FIGS. 1 and 2, a multiaxial microelectromechanical sensor is illustrated schematically and is designated as a whole by 1. The microelectromechanical sensor 1 comprises a structural component 2 and a control circuit or ASIC (Application-Specific Integrated Circuit) 3.

Figure 3:
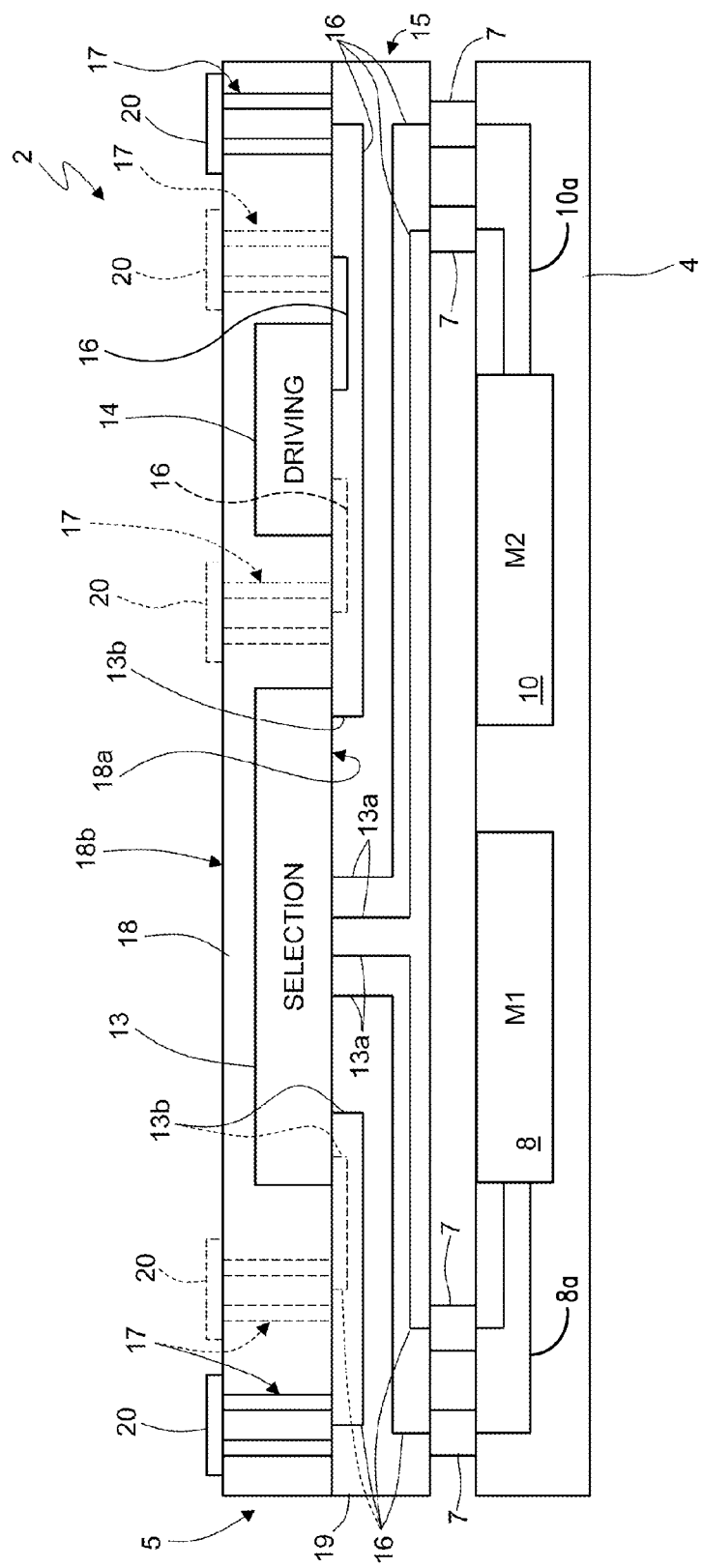
FIG. 3 is a cross section through a portion of the microelectromechanical device FIG. 1.

The structural component 2 in turn comprises a microstructure chip 4 and a protective cap 5, bonded to one another through conductive bonding regions 7, see FIG. 3.

According to an embodiment, the microstructure chip 4 accommodates a first microelectromechanical structure 8 and a second microelectromechanical structure 10, which form structural parts, respectively, of a multiaxial accelerometer and of a multiaxial gyroscope of a capacitive type. In what follows, these microelectromechanical structures will be referred to, for simplicity, as "microstructure 8" and "microstructure 10".

The first microstructure 8 and the second microstructure 10 have respective sets of terminals 8a, 10a coupled to the protective cap 5 through respective conductive bonding regions 7 (FIG. 3).

The protective cap 5 is bonded to the microstructure chip 4 not only through the conductive bonding regions 7, but also through a bonding ring (not shown) and is arranged to protect the microstructures 8, 10. The bonding ring and the conductive bonding regions 7 are preferably made from a single conductive bonding layer and are made of the same conductive material. However, the conductive bonding regions 7 are electrically insulated from the bonding ring to enable proper routing of the signals.

The protective cap 5 comprises a selection module 13, a driving module 14, a routing structure 15, and through vias 17, for example of the TSV (through silicon via) type.

The selection module 13 and the driving module 14 are made in a portion of the protective cap 5, which, for convenience, will be hereinafter referred to as "substrate" 18. It is understood, however, that this portion of the protective cap 5 may comprise, in addition to a semiconductor substrate proper, further polycrystalline and monocrystalline semiconductor layers and dielectric layers or portions of layers, according to what may be desired to make the selection module 13, as well as the driving module 14.

The selection module 13 and the driving module 14 are accommodated in the proximity of a face 18a of the substrate 18 that is adjacent to the routing structure 15.

The routing structure 15 comprises a plurality of connection lines 16 arranged on several levels and embedded in a layer of dielectric material 19. The routing structure 15 hence enables provision of a plurality of fixed and non-coplanar connections between the microstructures 8, 10 and the selection module 13, between the selection module 13 and the driving module 14, and between the selection module 13 and the driving module 14 and contact pads 20 arranged on a face 18b of the substrate 18 opposite to the face 18a and coupled to respective signal terminals 3a of the control device 3 (FIGS. 1 and 2).

The selection module 13 has a plurality of first selection terminals 13a, second selection terminals 13b, and control terminals 13c, as shown schematically in FIG. 2 and FIG. 4. The first selection terminals 13a of the selection module 13 are coupled to the terminals 8a, 10a of the first microstructure 8 and of the second microstructure 10 through the routing structure 15 and the bonding regions 7, as explained hereinafter. The second selection terminals 13b are less numerous than the first selection terminals 13a and are coupled to respective contact pads 20. Connection of the second selection terminals 13b to the pads 20 is obtained through the routing structure 15 and respective through vias 17, which traverse the substrate 18 from the face 18a adjacent to the routing structure 15 to the opposite face 18b.

In the embodiment illustrated herein, such as FIGS. 4 and 5, the control terminals 13c are coupled to respective outputs of the driving module 14. Alternatively, in the absence of the driving module 14, the control terminals 13c may be directly coupled to respective clock terminals 3b of the control device 3.

The selection module 13 comprises a plurality of switches 21 controlled by the control device 3 (here through the driving module 14) so as to couple the second selection terminals 13b to the first selection terminals 13a according to selectively one of a plurality of coupling configurations corresponding to respective operating conditions.

The switches 21 have first conduction terminals coupled to respective first selection terminals 13a and second conduction terminals coupled to respective second selection terminals 13b, as shown by way of example in FIG. 4. Moreover, control terminals of the switches 21 define respective control terminals 13c of the selection module 13. In greater detail, in one embodiment the first conduction terminals of the switches 21 are coupled to respective distinct first selection terminals 13a. Groups 21a of switches 21 have, instead, the respective second conduction terminals coupled to one and the same second selection terminal 13b.

The switches 21 are controlled in such a way that in each group 21a just one switch 21 at a time is closed, whilst all the others are open.

In one embodiment (FIG. 5), the microstructures 8, 10 provide acceleration signals AX, AY, AZ and angular-velocity signals ΩX, ΩY, ΩZ to respective first terminals 13a', 13a''. For simplicity, the case of unipolar signals is illustrated herein, but what has been explained applies indifferently also to the case of differential signals, except for the fact that a different number of first terminals 13a, second terminals 13b, and switches 21 is required. The first terminals 13a', which receive the acceleration signals AX, AY, AZ, are selectively connectable to one and the same second terminal 13b' through a first group 21a' of switches 21', whereas the first terminals 13a'', which receive the angular-velocity signals ΩX, ΩY, ΩZ, are selectively connectable to one and the same second terminal 13b'' through a second group 21a'' of switches 21''. The switches 21' of the first group 21a' and the switches 21'' of the second group 21'a' are closed selectively one at a time in rotation during operation of the microelectromechanical sensor 1.

With reference once again to FIGS. 1-3, the driving module 14 has inputs coupled to respective clock terminals 3b of the control device 3 through the routing structure 15, the through vias 17, and the pads 20 on the face 18b of the substrate 18. The driving module 14 receives clock signals CK1, . . . , CKM from the control device 3 and generates control signals SC1, . . . , SCN for the switches 21. The control signals SC1, . . . , SCN, which may be shared by switches 21 of distinct groups 21a, are provided to the control terminals 13c of the selection module 13 for determining a state (open or closed) of each switch 20. In this way, the driving module 14 determines the configuration of the selection module 13 and the operating condition of the microelectromechanical sensor 1.

In the example of FIG. 5, two clock signals CK1, CK2 are provided in parallel to respective inputs of the driving module 14. Alternatively, the clock signals may be provided in series through a single terminal or a small number of terminals. The clock signals CK1, CK2 assume in sequence the values illustrated in FIG. 6 during a step of reading the signals coming from the microstructures 8, 10 and simultaneously a zero value when the microelectromechanical sensor 1 is not in the reading step, such as for example during steps of power-on or entry into or exit from energy-saving (power-down) configuration. The driving module 14 comprises logic blocks 24 that implement respective logic functions F1, F2, F3 to generate three control signals SC1, SC2, SC3 as a function of the clock signals CK1, CK2. The control signals SC1, SC2, SC3 are provided each to the control terminals of a respective switch 21' of the first group 21a' and of a respective switch 21'' of the second group 21a''.

Figures 6, 7:
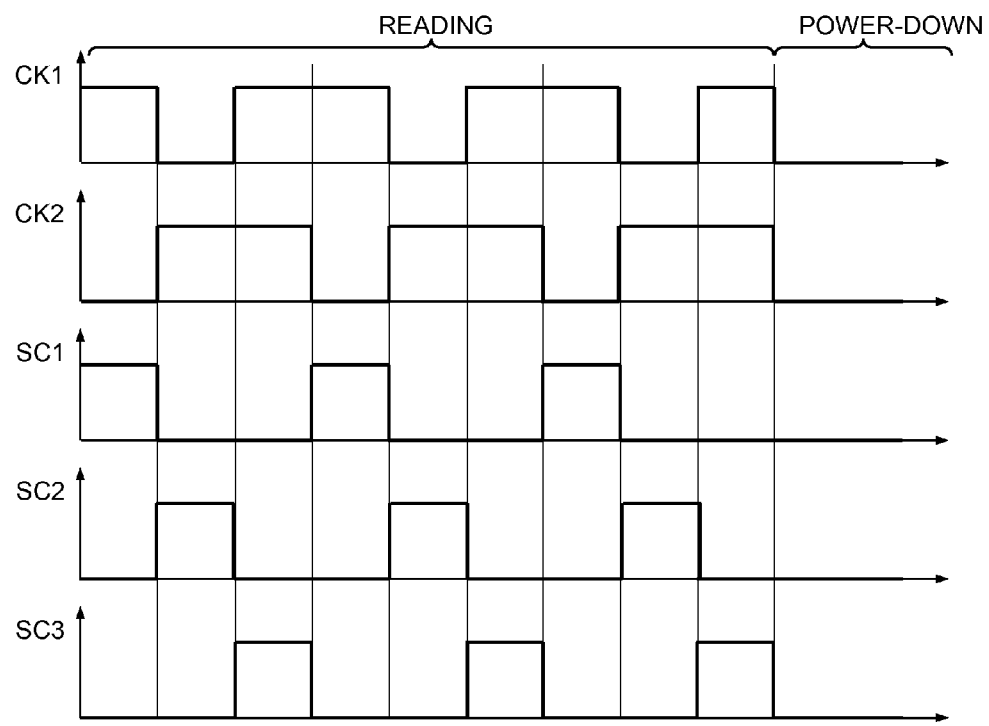
FIG. 6 shows graphs regarding quantities used in the microelectromechanical device according to the variant of FIG. 5.
FIG. 7 shows tables regarding logic functions used in the microelectromechanical device according to the variant of FIG. 5.

The logic functions F1, F2, F3 are defined by the tables shown in FIG. 7 in such a way that in each group 21a', 21a'' all the switches 21', 21'' will be closed selectively one at a time in rotation in the step of reading the microelectromechanical sensor 1.

Figure 8:
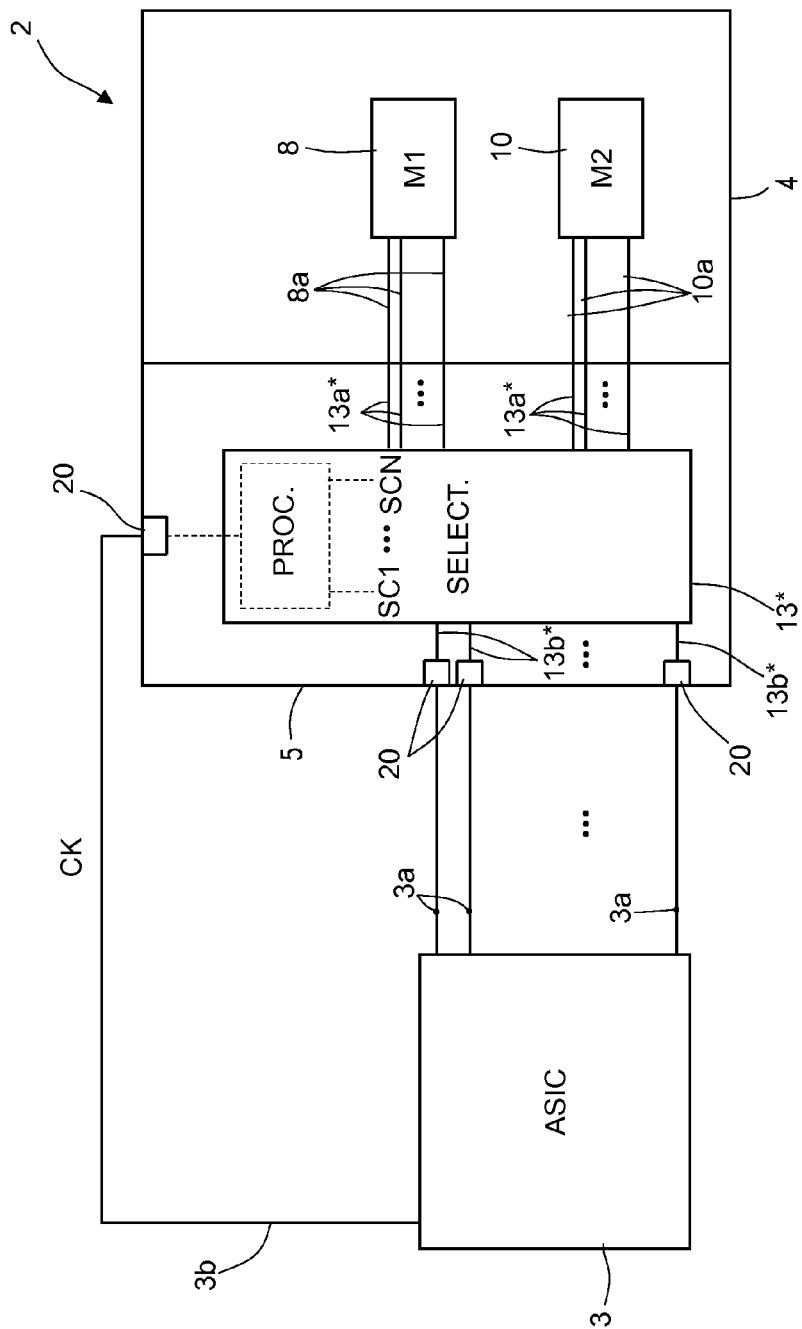
FIG. 8 is a simplified block diagram of a microelectromechanical device according to a different embodiment of the present disclosure.

According to a variant, illustrated schematically in FIG. 8, the microelectromechanical sensor 1 comprises a selection module 13* provided with memory and autonomous processing capability and generates the sequences of control signals SC1, . . . , SCN necessary for proper operation starting from a single clock signal CK provided by the control device 3.

In this case, a single clock terminal 3b is sufficient on the control device 3, and a single pad 20 is sufficient on the protective cap, in addition to the pads 20 necessary for coupling to the signal terminals 3a.

Figure 9:
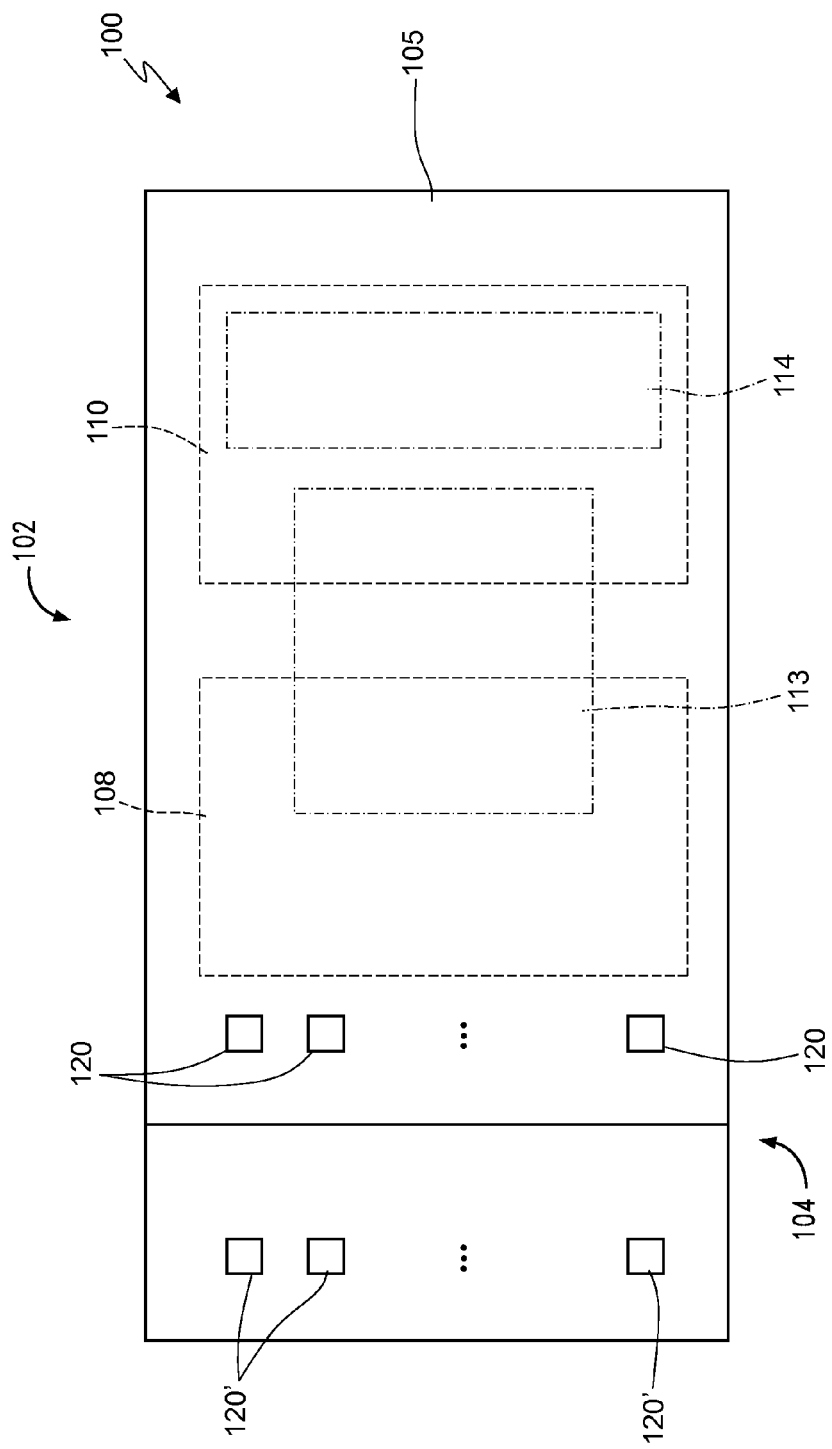
FIG. 9 is a top plan view of a microelectromechanical device according to a further embodiment of the present disclosure.

According to the embodiment illustrated in FIG. 9, a structural component 102 of a microelectromechanical sensor 100 comprises a microstructure chip 104, accommodating a first microstructure 108 and a second microstructure 110, and a protective cap 105. The protective cap 105 integrates a selection module 113, a driving module 114, and a routing structure (not shown) substantially as already described. On the protective cap 105 contact pads 120 are made for microstructures accommodated in the microstructure chip 104.

The microstructure chip 104 projects on at least one side with respect to the protective cap and, on the free portion, accommodates further contact pads 120'.

Figure 10:
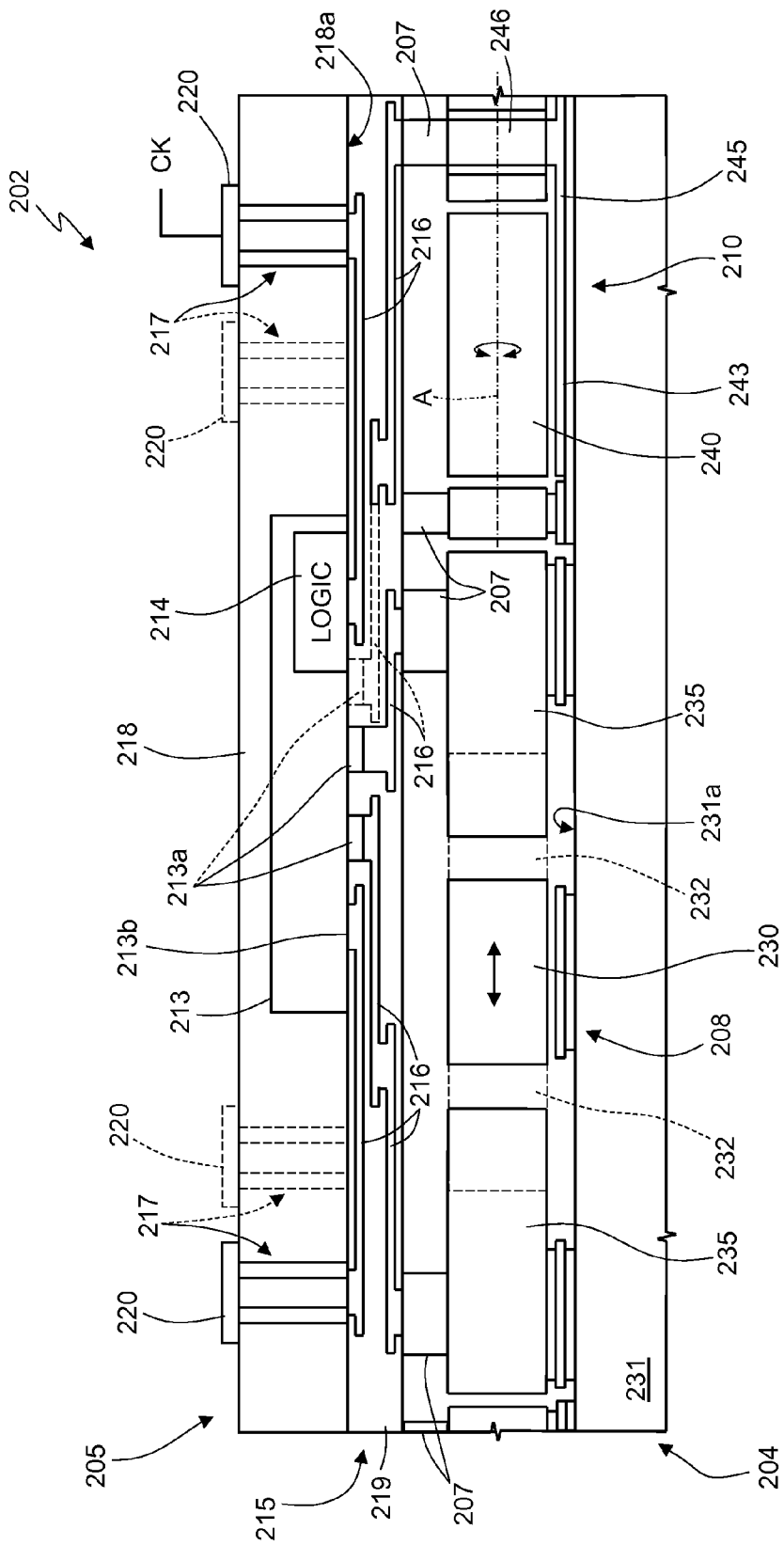
FIG. 10 is a cross section through a portion of a microelectromechanical device according to a further embodiment of the present disclosure.

FIG. 10 shows a structural component 202 of a microelectromechanical sensor according to a further embodiment of the disclosure. The microelectromechanical sensor is not illustrated entirely and comprises, in addition to the structural component 202, a control device or ASIC substantially as already described.

The structural component 202 comprises a microstructure chip 204 and a protective cap 205, bonded to each other by conductive bonding regions 207.

The microstructure chip 204 accommodates a first microstructure 208 and a second microstructure 210 that form structural parts, respectively, of a biaxial accelerometer (with in-plane detection) and of a uni-axial accelerometer (with out-of-plane detection).

In detail, the first microstructure 208 comprises a first detection mass 230 made of semiconductor material, which is constrained to a substrate 231 of the microstructure chip 204 by elastic connection elements (here not shown). The first detection mass 230 is movable with respect to the substrate 231 according to two independent translational degrees of freedom and can oscillate about a position of equilibrium. The first detection mass 230 is provided with plane movable electrodes 232 (represented with a dashed line), capacitively coupled to respective fixed electrodes 235, which are also plane, anchored to the substrate 231. Further movable and fixed electrodes, not shown, are arranged in a plane perpendicular to the moveable electrodes 232 and to the fixed electrodes 235.

The second microstructure 210 comprises a second detection mass 240, which is also made of semiconductor material and is constrained to the substrate 231 through further elastic connection elements (not shown) so as to oscillate about an axis A parallel to a face 231a of the substrate 231. The second detection mass 240 defines a movable electrode and is capacitively coupled to a fixed electrode 243 formed on the substrate 231.

The movable electrodes 232 and the fixed electrodes 235 of the first microstructure 208 are electrically coupled to the protective cap 205 through respective bonding regions 207 (the connections of the movable electrodes 232 exploit also the elastic connection elements and are not visible in FIG. 10).

The second detection mass 240 is electrically coupled to the protective cap 205 through the elastic connection elements and respective bonding regions (the connections of the second detection mass 240 are not visible in FIG. 10).

The fixed electrode 243 of the second microstructure 210 is electrically coupled to the protective cap 205 through connection lines 245 that develop on the substrate 231, conductive plugs 246, and respective bonding regions 207.

The protective cap 205 is bonded to the microstructure chip 204 through the bonding regions 207 and a bonding ring (not shown) and is arranged as protection for the microstructures 208, 210. The bonding ring and the conductive bonding regions 207 are preferably made of one and the same conductive bonding layer and are made of one and the same conductive material. However, the conductive bonding regions 207 are electrically insulated from the bonding ring to enable proper signal routing.

The protective cap 205 comprises a selection module 213 accommodated in a substrate 218, a routing structure 215, and through vias 217. In this case, the protective cap 205 is without an independent driving module, and possible logic functions are incorporated in the selection module 213 (schematically designated by the number 214).

The routing structure 215 comprises metal connection lines 216, embedded in a dielectric layer 219 and arranged on a number of distinct levels. The metal connection lines 216 are made, for example, of copper and are obtained using a "damascene" technique.

The selection module 213 is accommodated in the proximity of a face 218a of the substrate 218 adjacent to the routing structure 215 and has a plurality of first selection terminals 213a and second selection terminals 213b. The first selection terminals 213a are coupled to the first microstructure 208 and to the second microstructure 210 through the routing structure 215 and the bonding regions 207. The second selection terminals 213b are less numerous than the first selection terminals 213a and are coupled to respective contact pads 220 set on a face 218b of the substrate 218 opposite to the face 218a. The connection of the second selection terminals 213b to the pads 220 is obtained through the routing structure 215 and respective through vias 217, which traverse the substrate 218 from the face 218a to the opposite face 218b.

The selection module 213 is made substantially as already described and comprises a plurality of switches (here not shown) controlled so as to couple the second selection terminals 213b to the first selection terminals 213a according, selectively, to one of a plurality of coupling configurations corresponding to respective operating conditions. In this case, the selection module 213 is provided with memory and autonomous processing capability and receives a clock signal CK that is used to configure the connection of the second selection terminals 213b to the first selection terminals 213a.

Figure 11:
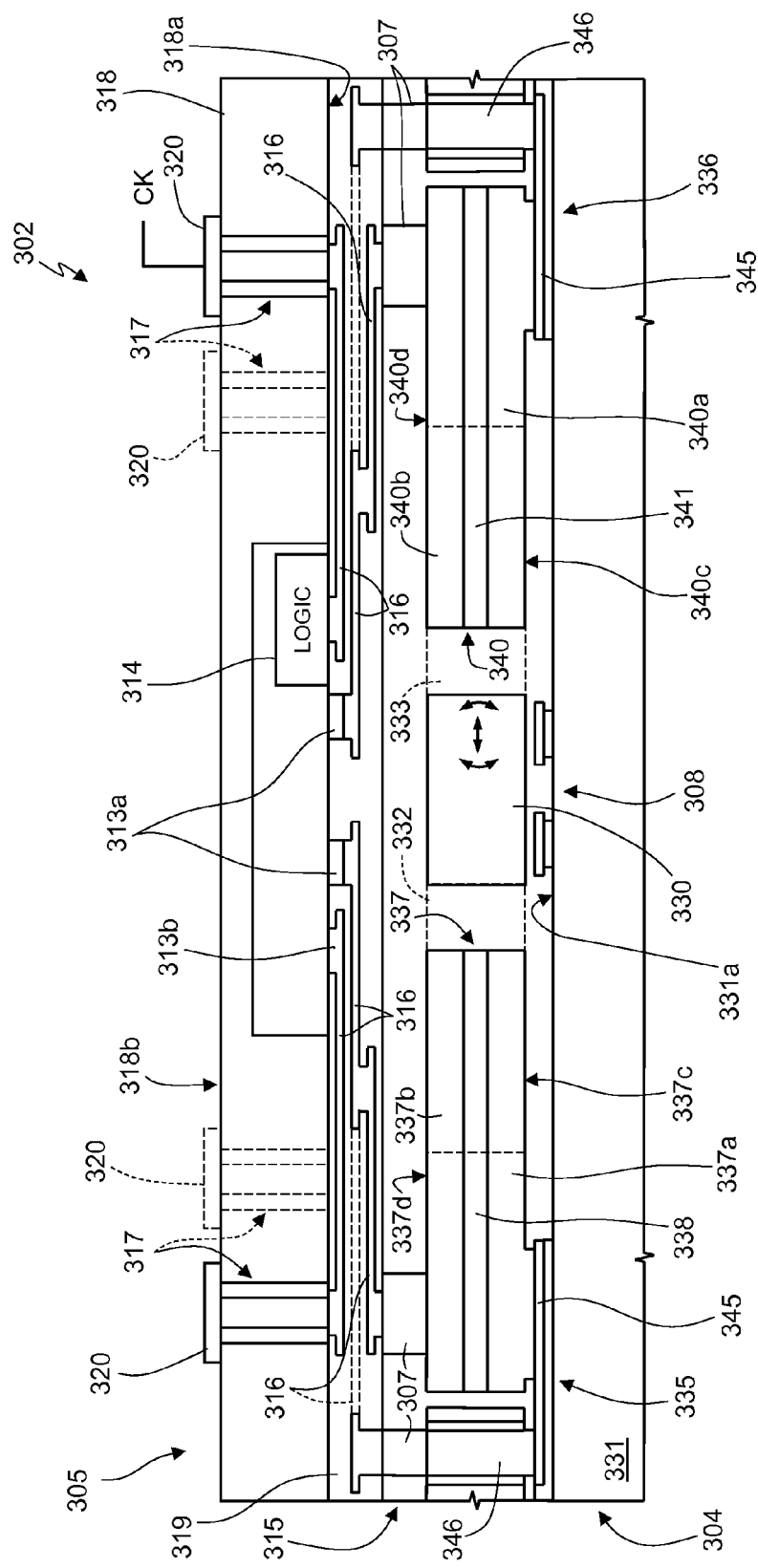
FIG. 11 is a cross section through a portion of a microelectromechanical device according to a further embodiment of the present disclosure.

FIG. 11 shows a structural component 302 of a microelectromechanical sensor according to a further embodiment of the disclosure. The microelectromechanical sensor is not illustrated entirely and comprises, in addition to the structural component 302, a control device or ASIC substantially as already described.

The structural component 302 comprises a microstructure chip 304 and a protective cap 305, bonded to each other by conductive bonding regions 307.

The microstructure chip 304 accommodates a microstructure 308 that forms structural parts of a biaxial accelerometer.

In greater detail, the microstructure 308 comprises a detection mass 330 made of semiconductor material, mechanically coupled to a substrate 331 of the microstructure chip 304 so as to have two degrees of freedom (a translational degree of freedom and a rotational degree of freedom about a non-centroidal axis in the embodiment described herein).

The detection mass 330 is provided with two groups of movable electrodes 332, 333 in the form of plane plates that extend in comb-like fashion in planes parallel to one another and perpendicular to a face 331a of the substrate 331. In addition, the two groups of movable electrodes 332, 333 are substantially symmetrical.

The microstructure 308 further comprises two groups of fixed electrodes 335, 336, fixed to the substrate 331 and capacitively coupled to the groups of movable electrodes 332, 333, respectively.

The group of fixed electrodes 335 comprises electrode structures 337, which are also in the form of plane plates that extend in comb-like fashion towards the detection mass 330. The movable electrodes 332 and the electrode structures 337 extend towards one another and are comb-fingered.

Each electrode structure 337 comprises a respective first fixed electrode 337a and a respective second fixed electrode 337b, both made of polycrystalline silicon and insulated from one another by a dielectric region 338. The first fixed electrode 337a, the dielectric region 338, and the second fixed electrode 337b form in order a stack in the direction perpendicular to the face 331a of the substrate 331. The first fixed electrode 337a occupies a portion of the fixed-electrode structure 337 that extends between the dielectric region 338 and a margin 337c facing the substrate 331. The second fixed electrode 337b occupies, instead, a portion of the electrode structure 337 that extends between the dielectric region 338 and a margin 337d opposite to the margin 337c and facing the protective cap 305.

The group of fixed electrodes 336 is rigidly fixed to the substrate 331, in a position opposite to the group of fixed electrodes 335 with respect to the movable mass 330. The group of fixed electrodes 336 comprises electrode structures 340 which are also in the form of plane plates that extend in comb-like fashion towards the detection mass 330 in planes parallel to one another and perpendicular to the face 331a of the substrate 331. The movable electrodes 333 and the electrode structures 340 extend towards one another and are comb-fingered.

Each electrode structure 340 comprises a respective first fixed electrode 340a and a respective second fixed electrode 340b, both made of polycrystalline silicon and are insulated from one another by a dielectric region 341. The first fixed electrode 340a, the dielectric region 341, and the second fixed electrode 340b form in order a stack in a direction perpendicular to the face 331a of the substrate 331. The first fixed electrode 340b (coplanar to the first fixed electrode 337a of a corresponding electrode structure 337) occupies a portion of the fixed-electrode structure 340 that extends between the dielectric region 341 and a margin 340c facing the substrate 331. The fourth fixed electrode 340b (coplanar to the second fixed electrode 337b of a corresponding electrode structure 337) occupies, instead, a portion of the electrode structure 340 that extends between the dielectric region 341 and a margin 340d opposite to the margin 340c and facing the protective cap 305.

The first fixed electrodes 337a, 340a of the electrode structures 337, 340 are coupled to respective electrical connection lines 345, which develop on the substrate 331 and are coupled to the protective cap 305 through conductive plugs 346 and respective bonding regions 307.

The second fixed electrodes 337b, 340b of the electrode structures 337, 340 are bonded to the protective cap 305 through respective bonding regions 307.

Figure 12:
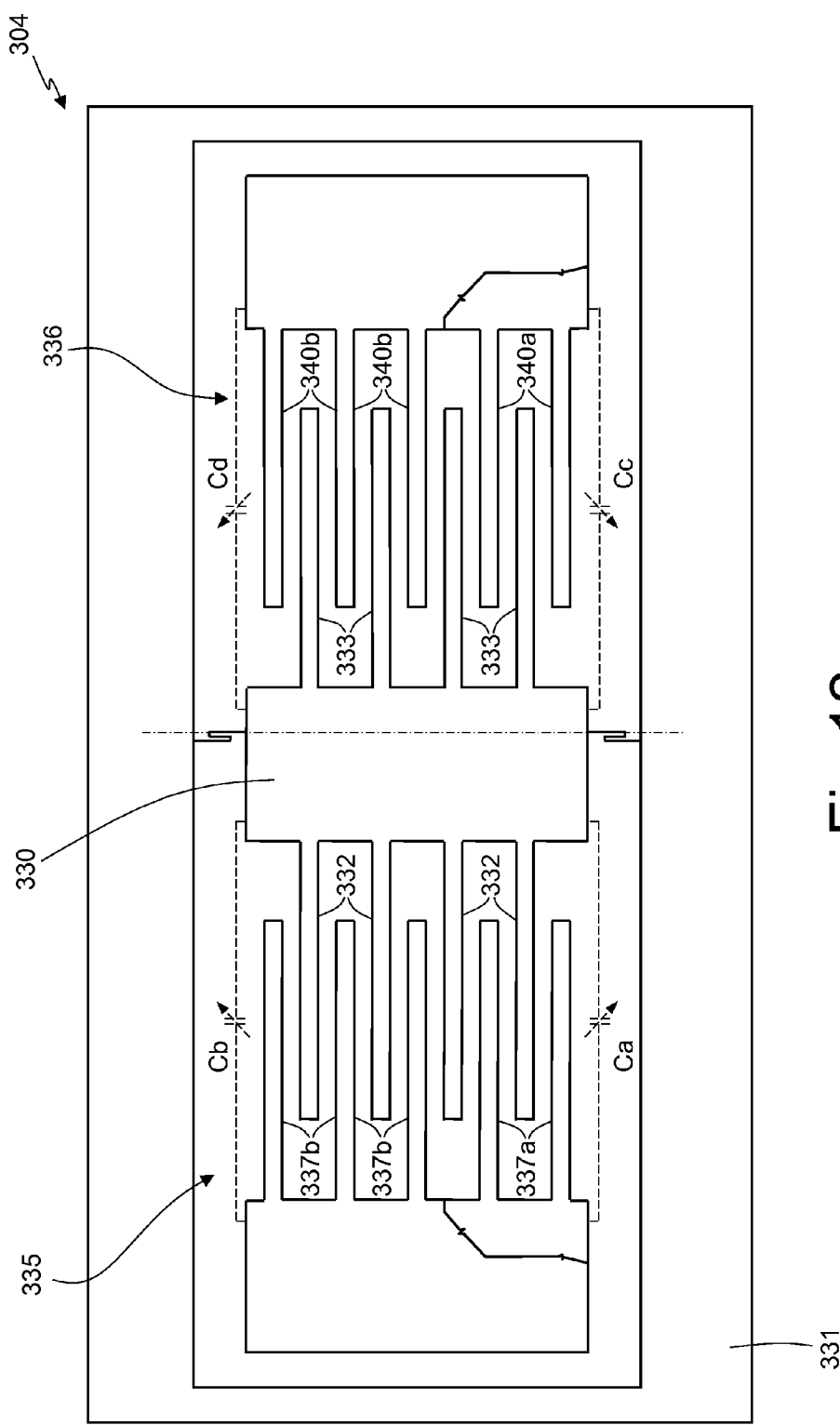
FIG. 12 is a simplified top plan view with parts removed of the microelectromechanical device of FIG. 11.

As shown in a simplified way in FIG. 12, the first fixed electrodes 337a and the second fixed electrodes 337b of the electrode structures 337 are capacitively coupled to respective movable electrodes 332 of the detection mass 3 and define with the latter respective capacitors that have an overall capacitance Ca, Cb. The third fixed electrodes 340a and fourth fixed electrodes 340b of the fixed-electrode structures 340 are capacitively coupled to respective movable electrodes 333 of the detection mass 3 and define with the latter respective capacitors that have overall capacitance Cc, Cd.

With reference once again to FIG. 11, the protective cap 305 comprises a selection module 313 accommodated in a substrate 318, a routing structure 315, and through vias 317.

The routing structure 315 comprises metal connection lines 316, embedded in a dielectric layer 319 and arranged on a number of distinct levels.

The selection module 313 is accommodated in the proximity of a face 318a of the substrate 318 adjacent to the routing structure 315 and has a plurality of first selection terminals 313a and second selection terminals 313b. The first selection terminals 313a are coupled to the microstructure 308 through the routing structure 315 and the bonding regions 307. The second selection terminals 313b are less numerous than the first selection terminals 313a and are coupled to respective contact pads 320 set on a face 318b of the substrate 318 opposite to the face 318a. Connection of the second selection terminals 313b to the pads 320 is obtained through the routing structure 315 and respective through vias 317, which traverse the substrate 318 from the face 318a to the opposite face 318b.

The selection module 313 is made substantially as already described and comprises a plurality of switches (here not shown) controlled so as to couple the second selection terminals 313b to the first selection terminals 313a according to selectively one of a plurality of coupling configurations corresponding to respective operating conditions. In this case, the selection module 313 is provided with memory and autonomous processing capability for implementing logic control functions (designated as a whole by the number 314) and receives a clock signal CK that is used to configure the connection of the second selection terminals 313b to the first selection terminals 313a.

The use of a selection module and of contact pads on the protective cap advantageously enables space to be freed on the microstructure chip and a greater area to be made available for the microstructures. It should in fact be considered that there is no need to arrange the pads exclusively around the microstructures. The pads may be provided also in regions of the cap that overly both the microstructures and the selection module, as well as the driving module (see in this connection in FIG. 1 the pads 20 with respect to the microstructures 8, 10, to the selection module 13, and to the driving module 14).

The number of pads necessary for connection towards the outside world, in particular towards the control device, is small, also considering the pads necessary to control the switches. Consequently, the design is simplified, also owing to the greater flexibility in the development of the connection lines, and it is possible to provide pads of large dimensions, favoring subsequent provision of the contacts.

Figure 13:
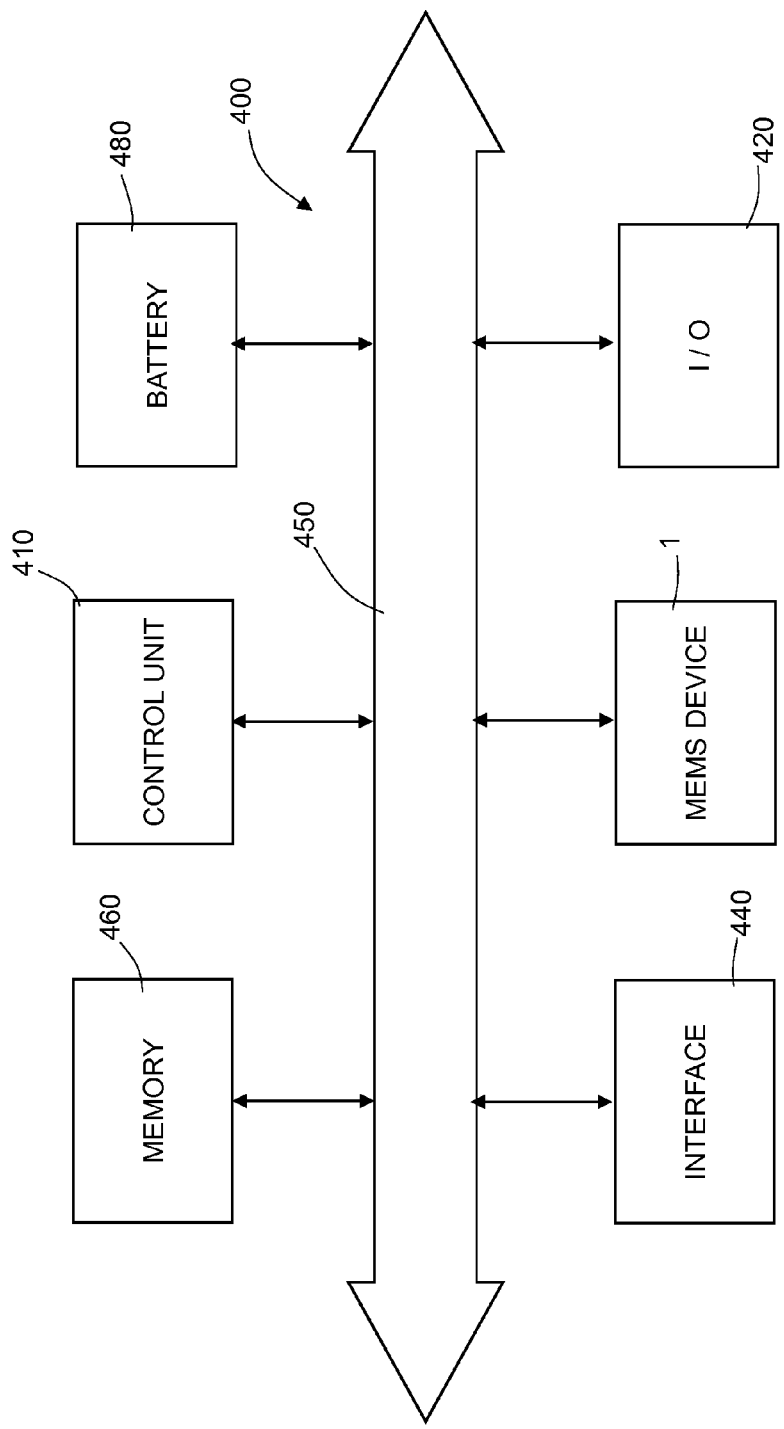
FIG. 13 is a simplified block diagram of an electronic system incorporating a microelectromechanical device according to an embodiment of the present disclosure.

FIG. 13 illustrates a portion of an electronic system 400 according to one embodiment of the present disclosure. The system 400 incorporates the microelectromechanical device 1 and may be used in devices such as, for example, a palm-top computer (personal digital assistant, PDA), a laptop or portable computer, possibly with wireless capability, a cellphone, a messaging device, a digital music player, a digital camera, or other devices designed to process, store, transmit, or receive information. For example, the microelectromechanical device 1 may be used in a digital camera to detect movements and carry out an image stabilization. In a further embodiment, the microelectromechanical device 1 is included in a motion-activated user interface for computers or consoles for videogames. In a further embodiment, the microelectromechanical device 1 is incorporated in a satellite-navigation device and is used for temporarily tracking the position in the case of loss of the satellite positioning signal.

The electronic system 400 may comprise a controller 410, an input/output (I/O) device 420 (for example, a keyboard or a display), the microelectromechanical device 1, a wireless interface 440, and a memory 460, of a volatile or nonvolatile type, which are coupled to each other through a bus 450. In one embodiment, a battery 480 may be used to provide the system 400. It should be noted that the scope of the present disclosure is not limited to embodiments having necessarily one or all of the devices listed.

The controller 410 may comprise, for example, one or more microprocessors, microcontrollers, and the like.

The I/O device 420 may be used to generate a message. The system 400 may use the wireless interface 440 to transmit and receive messages to and from a wireless communication network with a radiofrequency (RF) signal. Examples of wireless interface may comprise an antenna, a wireless transceiver, such as a dipole antenna, even through the scope of the present disclosure is not limited from this standpoint. Moreover, the I/O device 420 may provide a voltage representing what is stored either in the form of digital output (if digital information has been stored) or in the form of analog output (if analog information has been stored).

Modifications and variations may be made to the microelectromechanical device and to the method described, without thereby departing from the scope of the present disclosure.

In particular, the microelectromechanical device may incorporate one or more microelectromechanical sensors of any type, but also micromotors and microactuators.

Grouping and driving of the switches of the selection module may obviously vary and is basically determined by the mode of operation of the sensors, micromotors, or microactuators incorporated in the device.

In addition, the switches of the selection module may be arranged also on different selection levels, for example according to a tree structure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
controlling a microelectromechanical device, the device having a composite structure that includes a body having a microelectromechanical structure including a plurality of output terminals, a cap bonded to the body and electrically coupled to the microelectromechanical structure through conductive bonding regions, and in the cap, a selection module having first selection terminals coupled to respective ones of the plurality of output terminals of the microelectromechanical structure, a second selection terminal, and a control terminal, the controlling including:
outputting, by the selection module, a signal provided at a respective one of the output terminals by selectively coupling one of the first selection terminals to the second selection terminal in accordance with one of a plurality of coupling configurations corresponding to a respective one of a plurality of operating conditions.

2. The method of claim 1 wherein the body includes a second microelectromechanical structure including a plurality of second output terminals, and the selection module includes third selection terminals coupled to respective ones of the plurality of second output terminals, and a fourth selection terminal, the controlling further including:
outputting, by the selection module, a signal provided at a respective one of the second output terminals by selectively coupling one of the third selection terminals to the fourth selection terminal.

3. The method of claim 2 wherein the selection module includes a first plurality of switches, each of the first plurality of switches being coupled between a respective first selection terminal and the second selection terminal, and a second plurality of switches, each of the second plurality of switches being coupled between a respective third selection terminal and the fourth selection terminal.

4. The method of claim 1 wherein the selection module includes a first plurality of switches, each of the first plurality of switches being coupled between a respective first selection terminal and the second selection terminal.

5. A device, comprising:
a first substrate including a first sensor having a plurality of first output terminals;
a second substrate having a first surface and a second surface, the first surface being mechanically and electrically coupled to the first substrate, the second substrate being a cap that includes:
a selection module electrically coupled to the first sensor, the selection module including first selection terminals coupled to respective ones of the plurality of first output terminals, and a second selection terminal operatively coupled to a selected one of the first selection terminals, the selection module being configured to output at the second selection terminal a signal provided at a respective one of the first output terminals.

6. The device of claim 5 wherein the first substrate includes a second sensor.

7. The device of claim 6 wherein the selection module is electrically coupled to the second sensor.

8. The device of claim 7, further comprising:
a redistribution layer formed on the first surface of the second substrate;
electrical connection members formed between the redistribution layer and the first substrate, the electrical connection members being configured to electrically couple the selection module to the first and second sensors.

9. The device of claim 7 wherein the second substrate includes a plurality of contact pads formed on the second surface of the second substrate and a plurality of through vias configured to electrically couple the selection module to the contact pads.

10. The device of claim 6 wherein the second sensor includes a plurality of second output terminals, and the selection module includes second selection terminals coupled to respective ones of the plurality of second output terminals, and a third selection terminal operatively coupled to a second one of the second selection terminals.

11. The device of claim 5 wherein the second substrate includes a driving module electrically coupled to the selection module.

12. The device of claim 11 wherein the first substrate includes a second sensor and the selection module is electrically coupled to the second sensor.

13. The device of claim 12 wherein the second sensor includes a plurality of second output terminals, and the selection module includes:
    third selection terminals coupled to respective ones of the plurality of second output terminals; and
    a fourth selection terminal operatively coupled to a selected one of the third selection terminals, the selection module being configured to output at the fourth selection terminal a signal provided at a respective one of the second output terminals.

14. The device of claim 13 wherein the selection module includes a first plurality of switches coupled to the first selection terminals and a second plurality of switches coupled to the third selection terminals.

15. The device of claim 14 wherein the selection module includes a first input coupled to the first plurality of switches and a second input coupled to the second plurality of switches.

16. A method, comprising:
    forming a first sensor in a first substrate, the first sensor having a plurality of first output terminals;
    mechanically and electrically coupling a first surface of a second substrate to the first substrate;
    forming a selection module in the second substrate, the selection module including first selection terminals and a second selection terminal configured to be operatively coupled to a selected one of the first selection terminals;
    electrically coupling the first selection terminals directly to respective ones of the first output terminals; and
    forming a cap with the second substrate.

17. The method of claim 16, further comprising forming a second sensor in the first substrate.

18. The method of claim 17, further comprising coupling the selection module to the second sensor.

19. The method of claim 18, further comprising:
    forming a redistribution layer on the first surface of the second substrate;
    forming electrical connection members between the redistribution layer and the first substrate, the electrical connection members coupling the selection module to the first and second sensors.

20. The method of claim 18, further comprising forming a plurality of contact pads on a second surface of the second substrate and coupling a plurality of through vias between the selection module and the contact pads.

* * * * *